(12) United States Patent
Mueller et al.

(10) Patent No.: US 8,228,055 B2
(45) Date of Patent: Jul. 24, 2012

(54) APPARATUS AND METHOD FOR MEASURING CRITICAL CURRENT PROPERTIES OF A COATED CONDUCTOR

(75) Inventors: Fred M. Mueller, Los Alamos, NM (US); Jens Haenisch, Dresden (DE)

(73) Assignee: Los Alamos National Security, LLC, Los Alamos, NM (US)

( * ) Notice: Subject to any disclaimer, the term of this patent is extended or adjusted under 35 U.S.C. 154(b) by 372 days.

(21) Appl. No.: 12/560,303

(22) Filed: Sep. 15, 2009

(65) Prior Publication Data

US 2010/0066357 A1   Mar. 18, 2010

Related U.S. Application Data

(60) Provisional application No. 61/192,263, filed on Sep. 16, 2008.

(51) Int. Cl.
*G01P 3/48* (2006.01)
(52) U.S. Cl. ........ 324/166; 324/263; 324/249; 324/259; 324/260
(58) Field of Classification Search ............ 324/166, 324/228, 249, 259, 260, 263
See application file for complete search history.

(56) References Cited

U.S. PATENT DOCUMENTS

| 4,045,787 | A * | 8/1977 | Sidor et al. | 340/870.33 |
| 7,417,425 | B2 * | 8/2008 | Machi et al. | 324/261 |
| 2009/0131262 | A1 * | 5/2009 | Zhang et al. | 505/237 |

OTHER PUBLICATIONS

Furtner et al. ("Reel-to-Reel critical current measurement of coated conductors"; Supercond. Sci. Technol. 17 (2004) S281-S284).*
Furtner et al. ("Reel-to-Reel critical current measurement of coated conductors" Supercond. Sci. Technol. 17 (2004) S281-S284).*
Abraimov et al., "Scanning Laser Imaging of Dissipation in YBa2Cu3O7-d-coated Conductors," Applied Physics Letters, vol. 85, No. 13 (Sep. 2004) pp. 2568-2570.
Amemiya et al., "Experimental Determination of Two-Dimensional Critical Current Density Distribution in YBCO Coated Conductors," Superconductor Science and Technology, vol. 14 (Jul. 2001) pp. 611-617.
Carr Jr., "Loss in a Striated Coated Conductor," Superconductor Science and Technology, vol. 20 (Jan. 2007) pp. 168-175.
Coulter et al., "Position and Magnetic Field Angle Dependent Ic for Long-Length Coated Conductors," IEEE Trans. on Appl. Superconductivity, vol. 17, No. 2 (Jun. 2007) pp. 3394-3397.
Dam et al., "Origin of High Critical Currents in YBa2Cu3O7-d Superconducting Thin Films," Nature, vol. 399 (Jun. 1999) pp. 439-442.
Feldmann et al., "Influence of Nickel Substrate Grain Structure on YBa2Cu3O7-x Supercurrent Connectivity in Deformation-Textured Coated Conductors," Applied Physics Letters, vol. 77, No. 18 (Oct. 2000) pp. 2906-2908.

(Continued)

*Primary Examiner* — Huy Q Phan
*Assistant Examiner* — Temilade S Rhodes-Vivour
(74) *Attorney, Agent, or Firm* — Samuel L. Borkowsky

(57) ABSTRACT

The transverse critical-current uniformity in a superconducting tape was determined using a magnetic knife apparatus. A critical current $I_c$ distribution and transverse critical current density $J_c$ distribution in YBCO coated conductors was measured nondestructively with high resolution using a magnetic knife apparatus. The method utilizes the strong depression of $J_c$ in applied magnetic fields. A narrow region of low, including zero, magnetic field in a surrounding higher field is moved transversely across a sample of coated conductor. This reveals the critical current density distribution. A Fourier series inversion process was used to determine the transverse $J_c$ distribution in the sample.

5 Claims, 9 Drawing Sheets

OTHER PUBLICATIONS

Glowcki et al., "A New Method for Decreasing Transport AC Losses in Multifilamentary Coated Superconductors," Physica C, vol. 357-360 (Aug. 2001) pp. 1213-1217.

Grilli et al., "Modeling High-Temperature Superconducting Tapes by Means of Edge Finite Elements," IEEE Trans. on Appl. Superconductivity, vol. 17, No. 2 (Jun. 2007) pp. 3155-3158.

Kim et al., "Critical Persistent Currents in Hard Superconductors," Physical Review Letters, vol. 9, No. 7 (Oct. 1962) pp. 306-309.

Kiss et al., "Low Temperature Scanning Laser Microscopy of YBCO Coated IBAD Tapes," IEEE Trans. on Appl. Superconductivity, vol. 15, No. 2 (Jun. 2005) pp. 3656-3659.

Kreiskott et al., "Reel-to-Reel Preparation of Ion-Beam Assisted Deposition (IBAD)-MgO Based Coated Conductors," Superconductor Science and Technology, vol. 17 (Feb. 2004) pp. S132-S134.

Pan et al., "Comparison of Small-Field Behavior in MgB2, Low- and High-Temperature Superconductors," Physical Review B, vol. 73 (Feb. 2006) pp. 052506-1-052506-4.

Selvamanickam et al., "Progress in Scale-Up of Second-Generation HTS Conductor," Physica C, vol. 463-465 (May 2007) pp. 482-487.

Ten Haken et al., "A New Experimental Method to Determine the Local Critical Current Density in High-Temperature Superconducting Tapes," Physica C, vol. 334 (Mar. 2000) pp. 163-167.

Zehetmayer et al., "Assessment of the Local Supercurrent Densities in Long Superconducting Coated Conductors," Applied Physics Letters, vol. 90 (Jan. 2007) pp. 032506-1-032506-3.

Zhang et al., "Progress in AMSC Scale-Up of Second Generation HTS Wire," Physica C, vol. 463-465 (May 2007) pp. 505-509.

* cited by examiner

US 8,228,055 B2

APPARATUS AND METHOD FOR MEASURING CRITICAL CURRENT PROPERTIES OF A COATED CONDUCTOR

RELATED APPLICATIONS

This application claims the benefit of U.S. Provisional Patent Application Ser. No. 61/192,263 filed Sep. 16, 2008, incorporated by reference herein.

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present invention relates generally to coated conductors and to devices and methods for measuring current properties of these materials.

BACKGROUND OF THE INVENTION

High-temperature superconducting (HTS) tapes, based on $YBa_2Cu_3O_{7-\delta}$ (YBCO), are prepared on textured metallic substrates. The quality of these films with respect to their current-carrying capability, especially in applied magnetic fields, has increased steadily over the years due to a continuous world-wide effort to develop commercial HTS applications. Self-field $I_c$ values of over 700 Amperes ("A") per centimeter ("cm") width at 77 K, and conductor lengths of near-kilometer ("km") length have been achieved. In addition, tape widths are also anticipated to expand to 10 centimeters. For the production of high-quality coated conductors, not only the longitudinal but also the transverse homogeneity in critical current density ("$J_c$") is essential. This is especially true with respect to desired striations for AC applications to reduce hysteresis losses. It is also important for assuring a continuing high and uniform current-carrying capability over length for the production of long coated conductors by providing immediate feedback to control production parameters.

The $J_c$ distribution in superconducting thin films can be determined using methods involving magneto-optics, magneto-scan, laser scanning or patterning individual bridges. Many of these methods are either destructive or slow and, therefore, are not suited to monitor tapes for quality control. An apparatus and method for nondestructive, real-time measurement of current distribution in coated conductors remains desirable.

SUMMARY OF THE INVENTION

In accordance with the purposes of the present invention, as embodied and broadly described herein, the present invention includes an apparatus for measuring the magnetic flux of a coated conductor. The apparatus includes a first and a second pair of permanent magnets. Each permanent magnet has a magnetic north end and a magnetic south end. Each magnet has the same shape or nearly the same shape as the other magnets. The apparatus also includes two holders. Each holder has a slot for a pair of the magnets. Each slot has a first end and second end. Each slot is configured for receiving one of said first pair or said second pair of magnets, the pair of magnets arranged in the slot so that they are adjacent one another and the south end of one magnet and the north end of the other magnet are at the same end of the slot. The first holder and second holder are held in place opposite each other with a small space in between the holders for receiving a coated conductor. The slot of the first holder is aligned with the slot of the second holder, and the holders are arranged with the north end of a magnet of the first holder nearest the south end of a magnet of second holder. The device produces a magnetic field strength that becomes a minimum in the space between the first and second holder along an intersection between the first pair of permanent magnets and the second pair of permanent magnets. The device also includes means for moving a coated conductor through the space in between the two holders. The device also includes means for adjusting the holders in a direction transverse to the coated conductor without readjusting the position of the holders relative to each other.

The invention also includes a method for determining the critical current $I_c$ and a method for determining the transverse critical current density $J_c$ of a coated conductor using the above apparatus.

BRIEF DESCRIPTION OF THE DRAWINGS

The accompanying drawings, which are incorporated in and form a part of the specification, illustrate the embodiment(s) of the present invention and, together with the description, serve to explain the principles of the invention. In the drawings:

FIG. 3a shows $I_c$ data of a PLD coated conductor sample of 10 mm width, measured with the magnetic knife using a step size of 250 µm. FIG. 3b shows deconvolution of data from FIG. 3a scaled to $I_c$ per cm width. The deconvolved data of FIG. 3b show enhancement of smaller features seen in FIG. 3a.

DETAILED DESCRIPTION

An aspect of the invention is concerned with measuring the transverse $J_c$ distribution of coated conductor samples using a straightforward and inexpensive embodiment magnetic knife design where the magnetic field was generated by $Nd_2Fe_{14}B$ permanent magnets. $Nd_2Fe_{14}B$ is a hard-magnetic material with a saturation magnetization of about 1.4 Tesla ("T"). The magnetic field at the surface of commercial $Nd_2Fe_{14}B$ magnets of cm dimensions is typically 300 mT. Two magnets in close proximity develop fields of order 600 mT. Such a field can suppress $J_c$ outside the magnetic knife region by a factor 5. Cryogenic Hall probe measurements confirmed the spin-reorientation at 135 K, i.e. the opening of a spin cone around the easy axis with an angle of up to 30°, does not result in a change in the direction of the magnetic field between two $Nd_2Fe_{14}B$ magnets. The magnitude of the field changes by less than 4% between 75 K and room temperature.

The magnetic knife concept was first introduced by ten Haken et al. using electromagnets. The magnetic knife utilizes the strong $J_c(B)$ dependence in HTS when the field is applied parallel to the crystallographic c-axis and tape normal. According to the present invention, in using permanent magnets and adapting the deconvolution process, as described below, the magnetic knife becomes more suitable for industrial application because it is independent of an external power source, measures more quickly, and also less expensive.

Figure 1A:
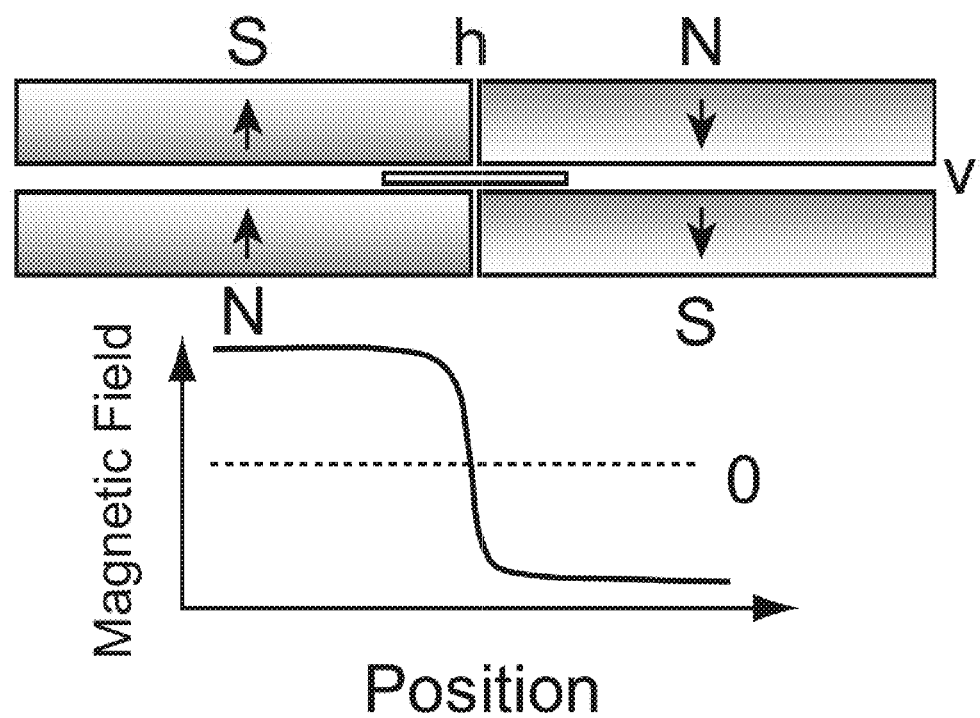
FIG. 1a shows a schematic view of the arrangement of the permanent magnets of an embodiment magnetic knife relative to superconducting tape and the field profile in the plane of the tape (thin gray inset). Current is flowing into the figure plane.

FIG. 1a shows a schematic view of the arrangement of the permanent magnets of an embodiment magnetic knife relative to superconducting tape and the field profile in the plane of the tape. Current is flowing into the figure plane. Relative to the tape, the magnets are arranged in such a way that in the transverse direction, the magnetic field in the plane of the tape sample changes sign. The magnetic field goes through a line of zero-field, shown in field profile along the intersection between the set of magnets above the tape and the set of magnets below the tape. For an embodiment magnetic knife, this transition region takes the magnetic field from around −600 mT through zero to around +600 mT and is scanned transversely across the sample.

Figure 1B:
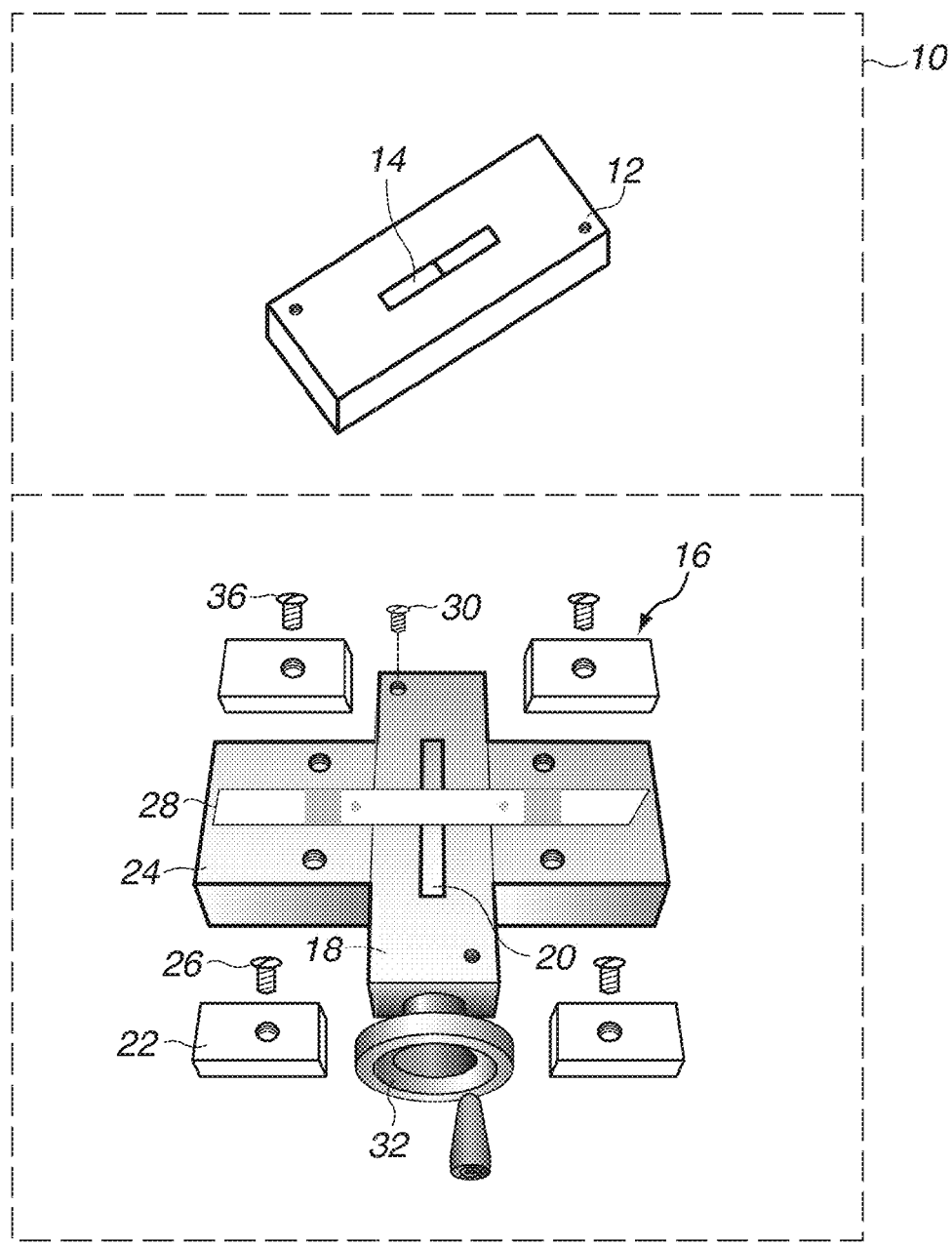
FIG. 1b shows an exploded top view of an embodiment magnetic knife with tape sample.
Figure 1C:
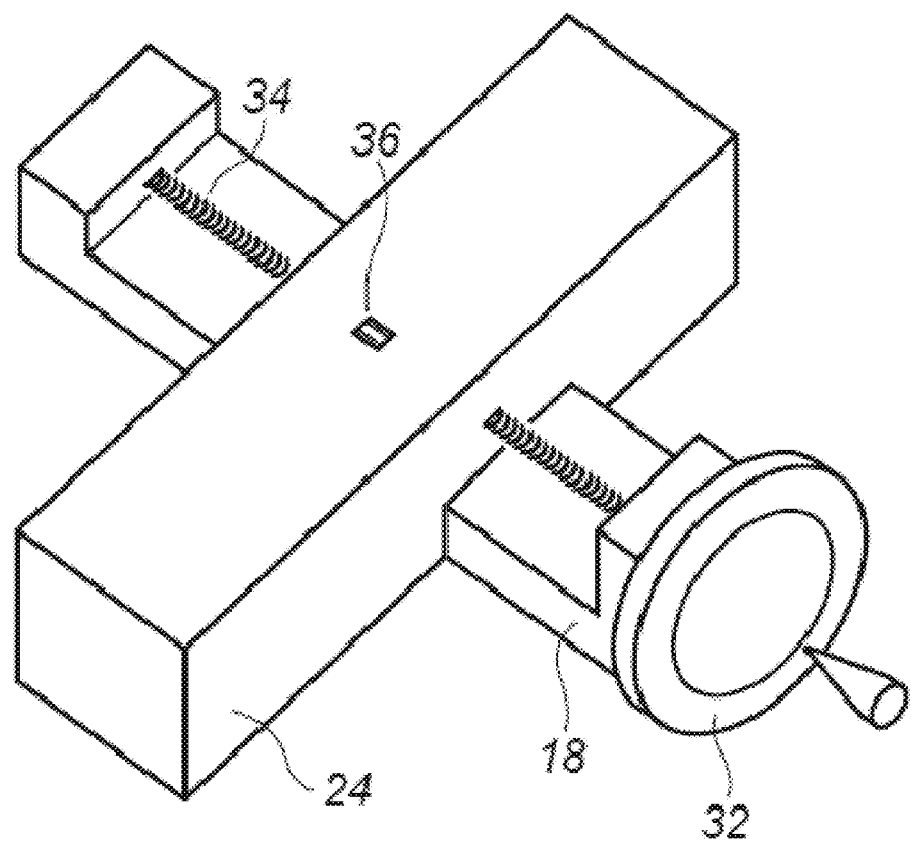
FIG. 1c shows a view from the bottom side of the magnetic knife. From the underside can be seen a threaded screw that engages the crank such that the screw turns when the crank turns. The position of the screw is fixed. A small opening in the bottom piece is configured for a nut and positioned such that the nut is flush with the surface of the bottom piece. As the crank is turned, the bottom piece moves relative to the magnet holder (the magnets are on the topside of the part with the crank). This way, the tape is stationary and held in place with the guides.
Figure 1D:
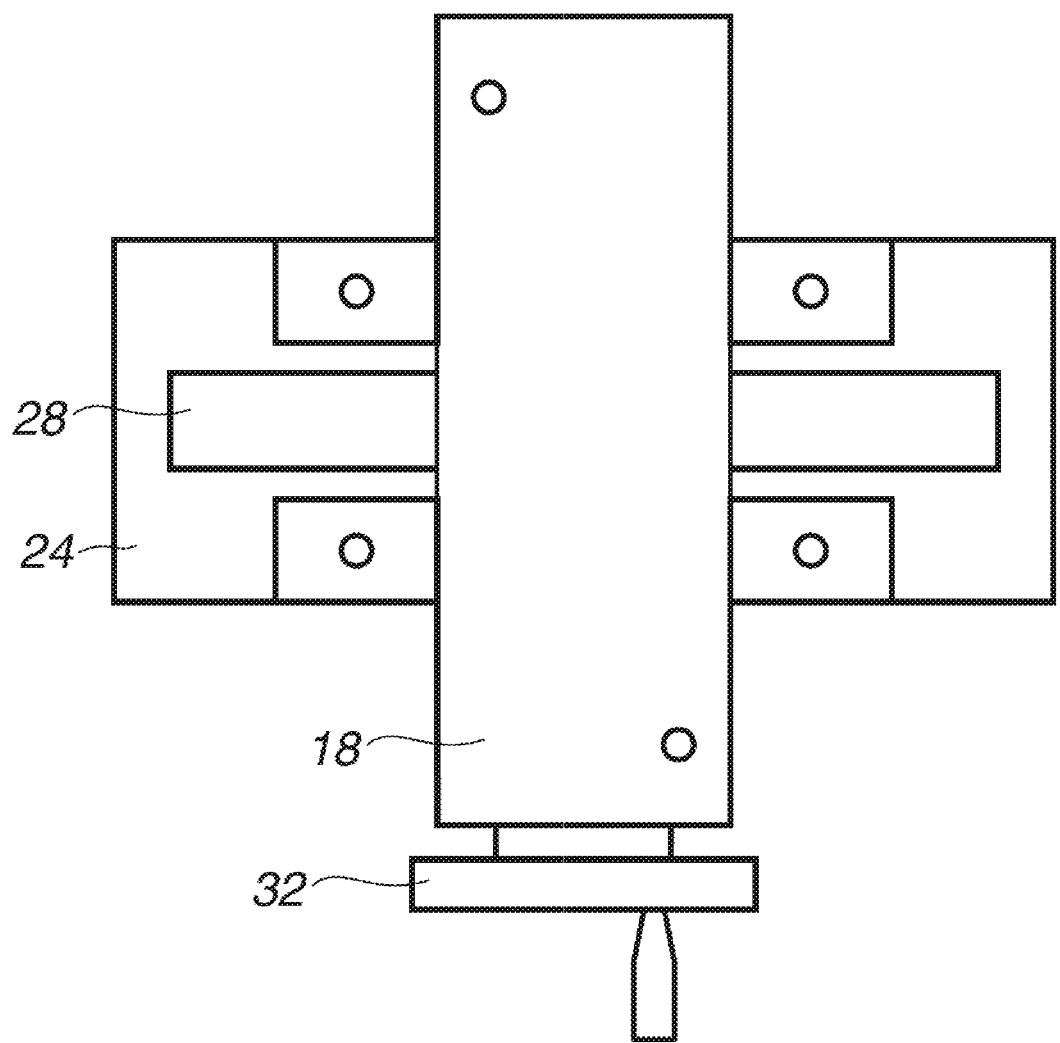
FIG. 1d shows an assembled top view of the magnetic knife. The tape is the silver-coated ribbon. The magnets in their holders are cut and reversed left to right to form the knife. The current are squares and voltage taps are circles. To assemble the device, the piece at the top left is placed in a vertical direction and the guides are screwed in such that the tape can move between the guides horizontally but not transversely.

FIG. 1b shows a view of magnetic knife 10 partially disassembled to show the position of the superconducting tape relative to the magnets prior to assembly. Magnetic knife 10 includes a first magnet holder 12 with a slot for receiving a first pair of permanent magnets 14, which are arranged as the top two magnets in FIG. 1a. In FIG. 1b, holder 12 is shown disengaged from bottom portion 16 of the magnetic knife; bottom portion 16 is also partially disassembled. Bottom portion 16 includes a second magnet holder 18 with a top side configured with a slot for receiving a second pair of permanent magnets 20, which are arranged as the bottom two magnets in FIG. 1a. Each magnet of first pair of permanent magnets 14 and second pair of permanent magnets 20 have the same dimensions and are of the same magnetic material, and all should fit snugly in the slots of their holders so that they do not jiggle around after putting them into the slots. Bottom portion 16 includes tape guides 22, which are attached to guide holder 24 with screws 26. Guides 22 are arranged in pairs spaced apart on either side of the superconducting tape 28 so that superconducting tape 28 can fit snugly in between each pair of guides 22 and slide in between them without any wiggle room. The guides permit sliding along the z-direction, but not transverse motion along the y-direction. After attaching the guides 22 to the guide holder, first magnet holder 12 is attached to the bottom portion 16 of the magnetic knife with screws 30. With magnetic knife 10 now assembled, as shown in FIG. 1d, the superconducting tape can be immobilized by taping with scotch tape it to holder 24. Now, current measurements can begin. The magnetic knife 10 is immersed in liquid nitrogen before making any measurements. After measuring the current passing through the superconducting tape 28 in this fixed position, crank 32 is turned a small amount, which moves the second magnet holder 18 relative to the guide holder 24, which changes the position of superconducting tape 28 along the transverse direction (i.e. the 'z' direction) relative to the magnets. The crank can be turned manually, or by some other means such as by using a stepper motor. The current moving through the tape in this new position is then measured and recorded. The position can be readjusted by turning the crank and additional measurements can be made at different positions along the same line. Afterward making all of the measurements along this line, the superconducting tape can be slid through the guides (after loosening the scotch tape) to a new position in the y-direction along the length of the superconducting tape. The superconducting tape 28 is then fixed again to the guide holder with scotch tape, and measurements along a different transverse can be taken and recorded. The sliding through the guides can be done manually, or by some other means such as, but not limited to, a stepper motor.

Figure 5:
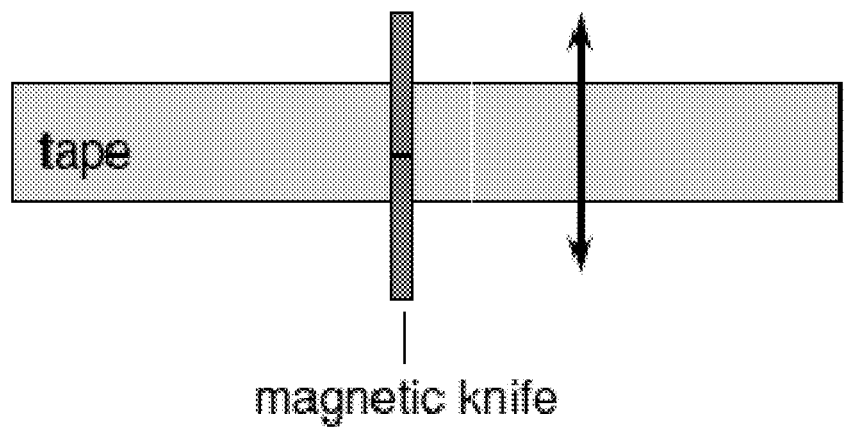
FIG. 5 shows two possibilities of measuring the transverse $J_c$ profile: (a) The magnetic knife is moved successively across the stationary tape and a Jc(y') value is measured for every position of the knife (laboratory set-up), and (b) a long tape is moved successively through an ensemble of magnetic knives and a number of Jc(y') values are measured simultaneously, which can be put together for the same value of x afterwards (set-up for production line).
Figure 5:
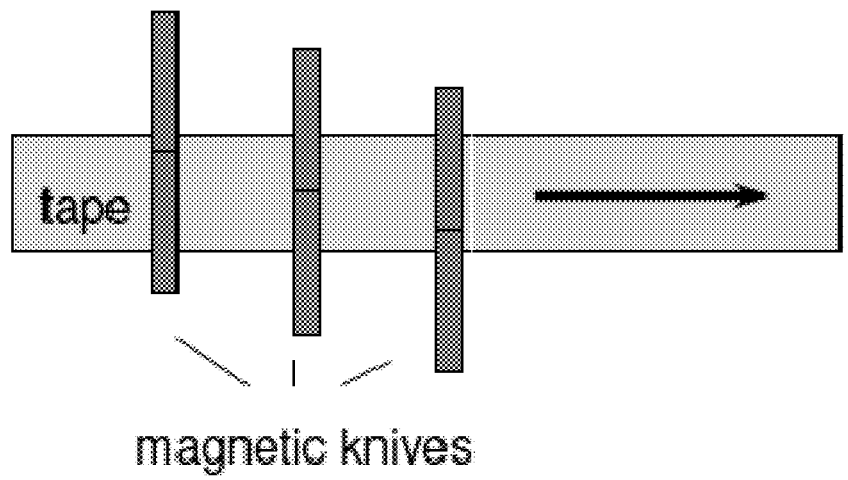

The mechanism for moving the second magnet holder 18 relative to the guide holder 24 is a simple mechanism including crank 32, a threaded rod, and a nut. The arrangement can be seen in FIG. 1c, which shows the underside of bottom portion 16. Crank 32 is connected to threaded rod 34 (in this embodiment, an M3 thread) and as crank 32 turns, so does threaded rod 34, which can turn but otherwise is held in place by slots in holder 18, and also by a hole in guide holder 24 that is large enough for threaded rod 34 to slide through. A small opening through the bottom of guide holder 24 is configured for receiving nut 36. Nut 36 has threads that match those of threaded rod 34. As threaded rod 34 turns, it moves through nut 36, but nut 36 is kept from moving in the direction of threaded rod 34 because of its stationary position in the small opening on the bottom of guide holder 24. To assemble, the crank/threaded rod is inserted through one end of holder 18 and, with the nut in position in the opening of guide holder 24, the rod is slid first through the hole in guide holder 24 and then through the nut until the end of the threaded rod engages a slot at the other end of holder 18, after which bottom portion 16 is assembled. Second magnet holder 18 can be attached to guide holder 24 by glue, screws, or some other means of attachment. Afterward, first magnet holder 12 is positioned above second magnet holder 18 and then screwed into place. The magnetic knife is ready for use. With the superconducting tape 28 in place, current measurements can begin. The position of the superconducting tape and the measured current at this position are both recorded. After recording the measurement, the crank is turned, which moves changes the position of the superconducting tape relative to the magnets by moving second magnet holder 18 relative to guide holder 24. As already mentioned, the crank can be turned manually or by some other means such as by using a stepper motor. The position and current are measured and recorded again. This continues for as many measurements as the user wishes to make. Afterward, the superconducting tape is slid through the guides to a new position, and additional measurements along a new transverse can be taken. The transverse and longitudinal movements can be done manually or by some other means such as by using a stepper motor. It should also be understood that there can be envisioned various ways for obtaining a current profile for a superconducting tape (see FIG. 5). The transverse Jc profile can be obtained as described above wherein the magnetic knife is moved successively across the stationary tape and a Jc(y') value is measured for every position of the knife (a laboratory set-up, for example). Alternatively, a set-up for a production line might involve using an ensemble of magnetic knives wherein a long superconducting tape is moved successively through the ensemble, and a number of Jc(y') values are measured simultaneously, which can be put together to obtain a profile for the tape after recording all of the measurements.

In an embodiment, each magnet had the dimensions 5 mm×5 mm×20 mm, which is well suited for tapes up to 10 mm wide. Wider tapes can be measured using larger magnets. FIG. 1b shows an exploded top view of an embodiment magnetic knife with tape sample, and FIG. 1c shows a bottom view of magnetic knife. The tape is the silver-coated ribbon. The magnets in their holders are cut and reversed left to right to form the knife. The current are squares and voltage taps are circles. To assemble the device, the piece at the top left is placed in a vertical direction and the guides are screwed in such that the tape can move between the guides horizontally but not transversely.

Figure 3:
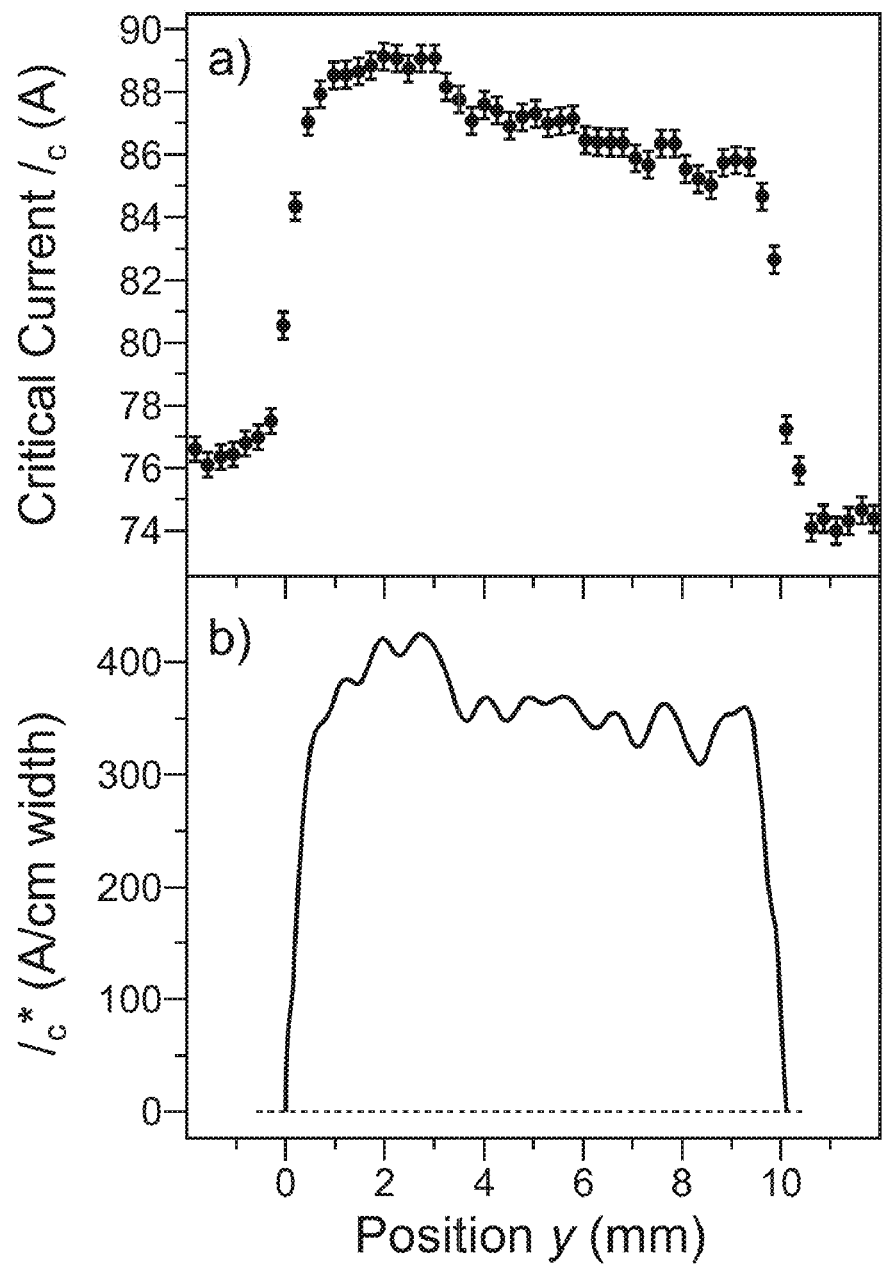

In an embodiment magnetic knife constructed to demonstrate the invention, the vertical spacing (in z direction, which is identical to the crystallographic c direction), "v", is around 0.5 mm. The horizontal spacing in the y direction, "h", can be varied between 0 mm and 2 mm, depending on the desired resolution. Zero-spacing gave accurate results. The device is used by measuring the critical current for a certain position of the magnetic knife on the tape, using a low-voltage, four-point technique. During the measurement, the device is immersed in liquid nitrogen, setting the temperature to 75.4 K at ambient pressure in Los Alamos. The magnetic knife is moved across the tape by a screw thread of 3 mm diameter (1 turn equals 0.5 mm movement), providing a positional accuracy of the order of 10 micrometers ("µm") (the resolution of a stepper motor is also about 10 µm). Current was applied through Cu press contacts, and voltage taps were soldered. However, both current and voltage contacts could be provided by sliding contacts. The critical current $I_c$ is determined by a voltage criterion of 1 µV. The characteristic length is not determined by the distance of the voltage taps (~12 mm) but rather by the width of the magnetic field in current direction (~4 mm), which can be taken as resolution in current direction (x) without the use of a deconvolution in x. Smaller magnets are possible; however, the background magnetic field would decrease. By assuring a voltage noise level of about 20 nV and eliminating thermal voltage offset of similar magnitude, an $I_c$ uncertainty of around 0.5% was achieved, see FIG. 3a. With each I(V) curve taking 10 seconds, a profile with a step size of 0.1 millimeter ("mm") can be measured in around 20 minutes This fine a step size, however, might not be needed in industrial screening, hence the time can be seen as upper limit.

The transport critical current of a superconductor may be measured by recording a V(I) curve, i.e. by measuring a voltage with increasing current. If the voltage or electric field exceeds a certain value that in most cases is 1 microvolt, or 1 microvolt per centimeter, the critical current for that temperature and applied magnetic field has been reached. This critical current depends strongly on the magnetic field; it falls as an inverse power law with field in the range of interest for this invention. Hence, by applying a magnetic field everywhere except over a small linear region, one virtually cuts out a little superconducting filament with the outside magnetic fields, hence the name magnetic knife for this technique. In any realization of a magnetic knife, one needs to (a) apply a current through the tape and (b) move the knife relative to the tape, (c) measure voltages and (d) perform an extraction of the current density from the measurements using an analytical technique. The superconducting tape is usually rectangular and a few microns thick, several millimeters wide, with varying length. There are no limits to the length of the tape; it could be meters or kilometers in length. In the embodiment knife shown in FIG. 1b-d, there are four rectangular shaped magnets, two above the tape and two below. By using the magnet configuration of the embodiment knife 10, one forces the magnetic field as a function of the distance across the superconducting tape to have a plane of zero-field (see FIG. 1a). Away from the middle, the magnetic field is quite strong, quenching the ability of the superconducting tape to carry current in those regions. In the middle, near the plane of zero-field, the tape will carry as much current as is possible. By combining a sequence of magnetic knife measurements across the tape, the current density is obtained.

Figure 2:
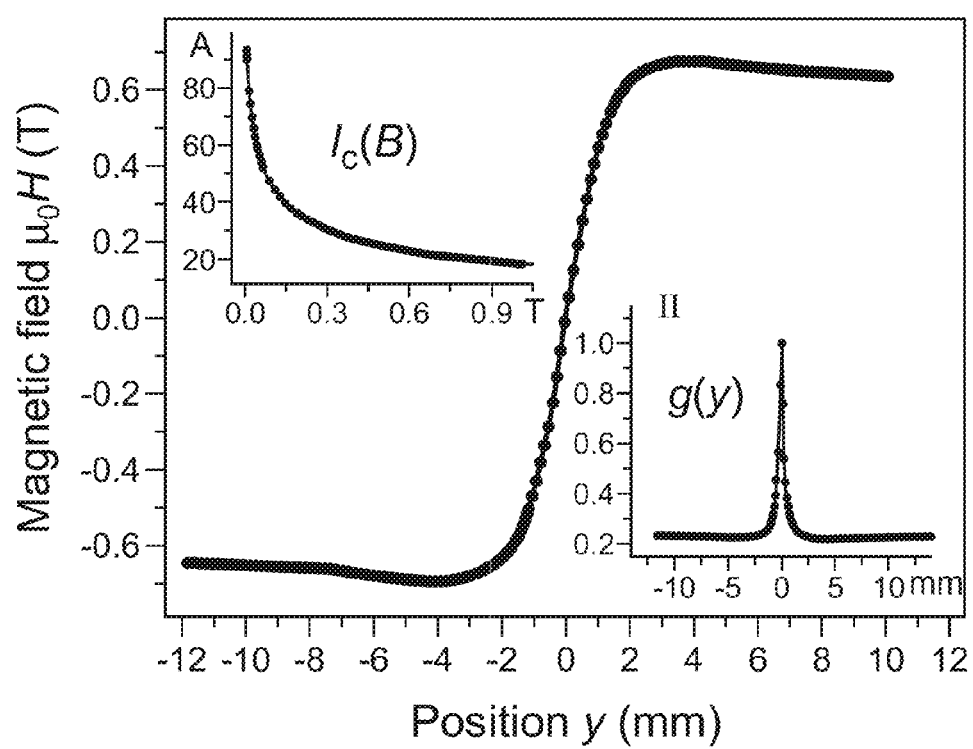
FIG. 2 shows the transverse magnetic field profile B(y) across the tape, measured with a Hall sensor of 100 µm diameter at room temperature. Inset I: Typical $I_c(B)$ dependence of a coated-conductor sample. Inset II: convolution function g(y) for the data of inset I.

FIG. 2 shows the magnetic-field profile of the device in the plane of the sample, measured at room temperature with a Hall sensor of 100 µm diameter. It shows a continuous increase of B from −600 mT to +600 mT in a zone of 1.3 mm in width. That is comparable to the magnetic knife based on electromagnets. In contrast, the profile with permanent magnets shows features outside the knife zone, due to the internal magnetic structure of the magnets (i.e. inhomogeneities), e.g. the maximum at y=±4 mm seen in FIG. 2 or slight ripples around y=±10 mm. Possible field rotations near the edge of the permanent magnets are straightened out by the magnetic field of the respective opposite magnet. This additional structure was taken into account in our inversion process described below. FIG. 2 (Inset I) shows a typical $I_c(B)$ dependence of a pulsed laser deposited coated-conductor sample. In fields up to 1 T, this dependence is usually described as a power law $I_c \propto B^{-\alpha}$. The parameter a for the sample of this work is 0.48. Below 100 mT at 75 K, the dependence can be described as a logarithmic decrease $I_c \propto \ln(B/B^*)$, where B* is a fitting parameter related to the accommodation field. The best fit in the range of interest for our purpose, i.e. combining these two regions, is a modification of Kim's model:

$$I_c(B) = I_c(0) \cdot (1 + |B/B_0|^\beta)^{-\alpha/\beta} \tag{1}$$

with $B_0$, $\alpha$ and $\beta$ being fitting parameters. $B_0$ (33 mT for the sample shown) is comparable to, but typically larger than, B*. The overall fits, which should be performed on each individual sample for highest accuracy, are accurate to about 0.2%. FIG. 2 (Inset II) shows the resulting convolution function g:

$$g(y) = I_c(B) \cdot B(y) \tag{2}$$

for the data of Inset I. The peak (i.e. the knife zone) has a FWHM (full width at half maximum) of 130 µm for a typical sample as shown here, if the horizontal spacing h between the magnets is zero. Both an increase in $B_0$ and a decrease in a result in an increase in the background in g and, hence, in its FWHM. An increase in β, typically ~1.5-2.2 at 75 K, increases the FWHM only marginally.

A Fourier series inversion was chosen for the deconvolution. The unit cell was doubled by mirroring the raw data at one sample edge. We used a grid of 315 points in total and considered Fourier terms up to the $100^{th}$ order. This truncation allows less resolution than the Nyquist criterion. In order not to mix noise features into the deconvolved data, the Fourier terms were multiplied by a low-pass soft filter term exp$(-\tau G^2)$, where G is $2\pi n$II, n is the term order and I=20 mm the width of the supercell (or twice the tape width). The parameter τ is set at that point where the size of the Fourier series is equal in amplitude to the experimental noise. The net resolution of the magnetic knife is 65 micrometers ("μm").

The magnetic knife consists of two nearly anti-symmetric magnetic regions, crudely left and right, with a line of zero-field in a region in the middle. A superconductor responds to the modulus or size of the field, not its direction or sign. Therefore, the current conductivity in the near zero field region is about 5 times higher than the larger regions in the wings, where the field is of the order 600 mT. Moreover, the currents flowing in the wing regions are averaged across the tape, whereas the conduction in the zero-field region is that of a thin filament. Hence, the zero-field region shows a variation characteristic of the knife filament, whose current density can be evaluated by measuring an ensemble of magnetic knife positions across the tape. Mathematically, this situation can be represented as a "folding' integral ("Faltung" in German). I(y) represents the total tape current when the knife position is at y, the tape width is w, and g(y-y') is the convolution or folding function. The function g is normalized to be 1 at zero. The mathematical problem to be solved is to extract the current density j(y'), assuming that I(y) and g(y-y') are known. A solution is to expand I, j, and g, in their Fourier representations. Because of the Faltung theorem, the convolution integral relation then devolves into a simple equation of the Fourier representations F(I), F(j), and F(g). Hence, F(j) is given by F(j)=F(I)/F(g). Once F(j) is known, j(y) may be found by inversing the Fourier transform of F(j).

FIG. 3a shows the $I_c$ data of a PLD coated-conductor sample of 10 mm width, measured with the magnetic knife using a step size of 125 micrometers. The slight difference in the background between the right and the left side is due to an off-axis magnetization in the permanent magnets as well as slight differences in the vertical separation distance. The same behavior is seen in the field profile and the convolution function. Hence, this asymmetrical offset is completely compensated for in our deconvolution process to the 0.1% level. The deconvolved curve for these data is shown in FIG. 3b, scaled in $I_c$ per cm width ($I_c^*$). Deconvolution essentially enhances and sharpens the features in the data, the rounding in the $I_c$ data being due to the finite width of the knife, e.g. $I_c$ values above the background level outside the tape region. The cut-off prevents unwarranted sharpening of data features and prevents the effect of noise amplification. Furthermore, the data reveal that the sample is homogeneous to within 10%, although $I_c^*$ exhibits several places of lower $I_c^*$ and a slight maximum around 3 mm.

Figure 4:
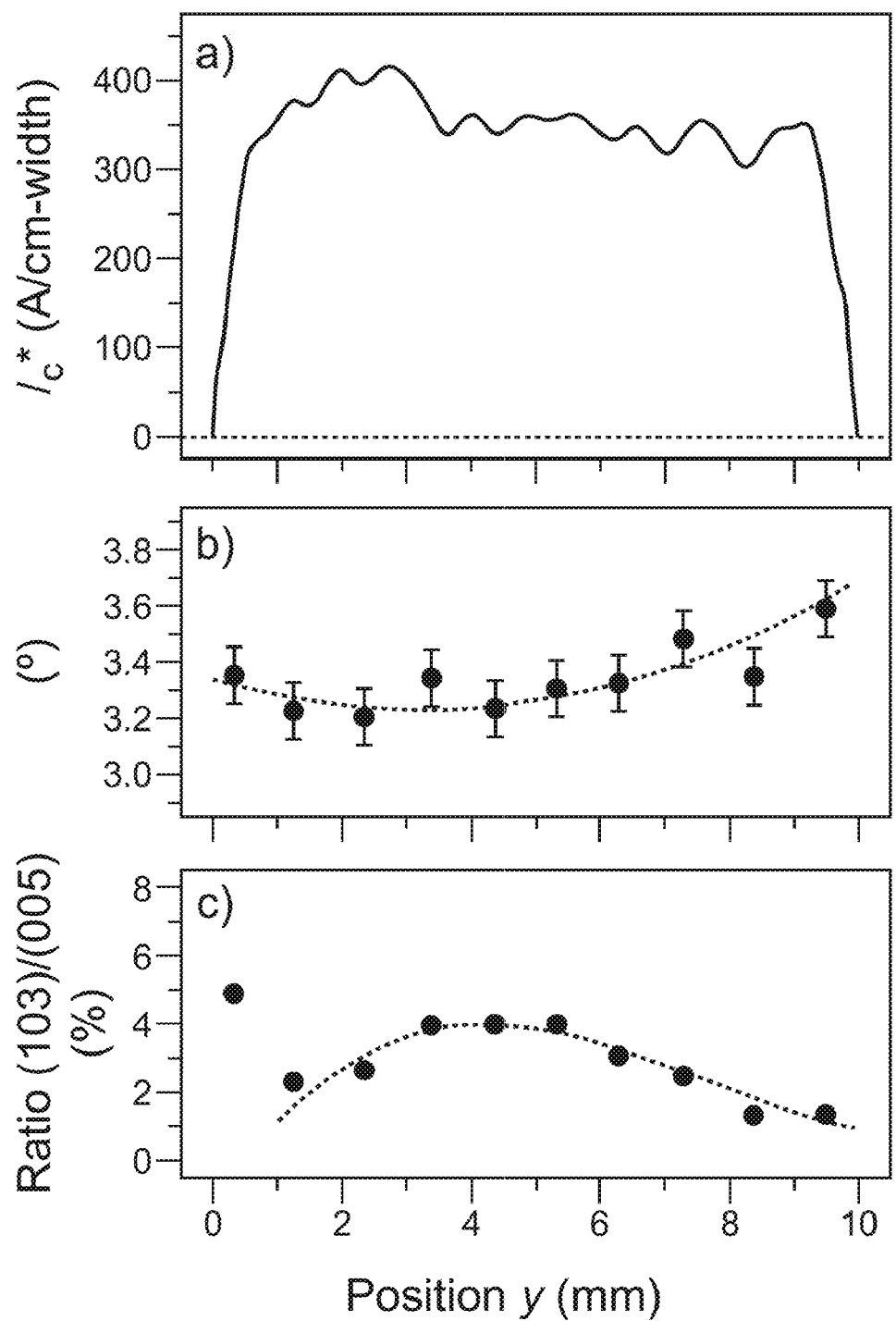
FIG. 4a through FIG. 4e show a comparison of the (a) $I_c^*$ profile, measured using the magnetic knife, with structural data (b) in-plane FWHM, (c) amount of (103) orientation, (d) film thickness and (e) $J_c$ data measured on individual filaments as a function of transversal tape position.
FIG. 4f shows critical current of the striated sample on three positions right, middle, left, each 2 mm apart (m being position of FIG. 4a, data of m and I shifted for clarity). The dotted lines are parabolic fits used as guides for the eye. Inset of FIG. 4a is a photograph of the striated sample.
Figure 4:
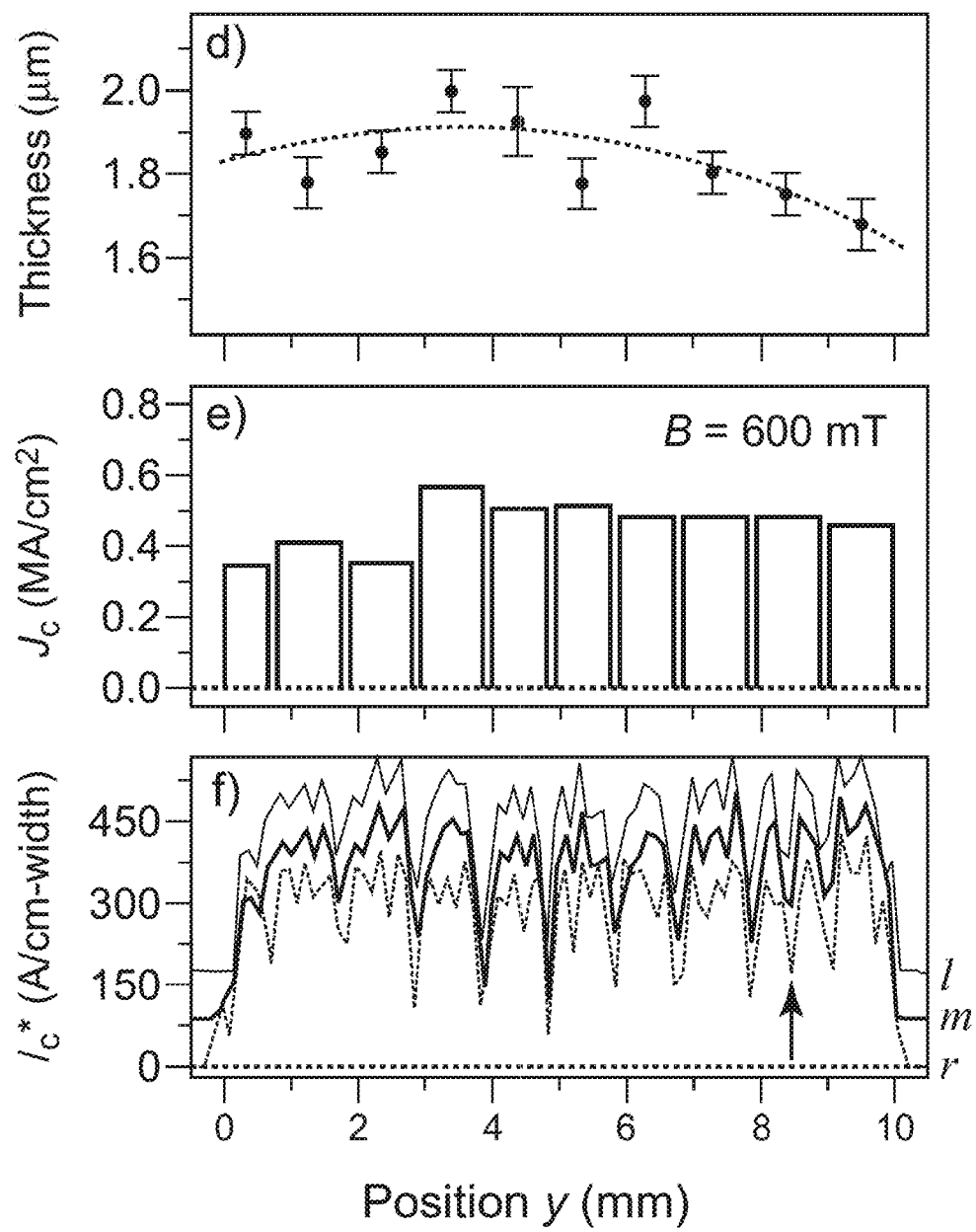

FIG. 4 shows a comparison between the magnetic knife $I_c^*$ profile (FIG. 4a) and structural data measured by x-ray diffraction (XRD) (b-c), thickness (d) as well as the $J_c$ data of individual filaments (e) as a function of transversal tape position y. The filaments (see inset of FIG. 4a) have been patterned mechanically and are clearly identifiable when the striated sample is measured with the magnetic knife, shown in FIG. 4f for three different positions 2 mm apart. The profiles of FIGS. 3 and 4a were measured at position m. The cuts are not resolved completely because a lower spatial resolution (step size 250 μm) was used. Each cut leads to a reduction of around 1% of superconducting cross section, as was determined by $I_c$ measurements of the whole sample with and without applied magnetic field, before and after the striation. $J_c$ of the individual filaments was measured differentially by successive blocking current flow through the filaments. X-ray diffraction data (minimum in ΔΦ, maximum in (103) amount) and the thickness profile of the superconducting filaments suggest that the laser plume center was shifted around 2 mm to the left from the center of the tape. That can explain the higher $I_c^*$ values at the left side of the tape. Furthermore, also the highest filament $J_c$ value was measured left of the tape center. $I_c^*$ falls to zero at the tape edges in a region of around 0.5 mm. The reason for this rather broad region might be an inferior microstructure (FWHM of the in-plane texture increases and YBCO (00I) peak intensities decrease), compared to the rest of the tape. The current density has to be zero exactly at the location of the sample edge in order to avoid singularities. It is apparent that the $I_c^*$ profile shows much finer features than are visible with x-ray diffraction. XRD is, hence, less preferable for quality control of sub-millimeter filaments than the magnetic knife. Whereas the $I_c^*$ profile shows the highest values at the left side of the tape, this region shows lower $J_c$ values when the individual filaments are measured in a homogeneous field of 600 mT. The low $J_c$ values could be due to a low $-J_c$ region outside the magnetic knife. The filaments were cut over a length of 9 mm, which is much longer than the length of the magnetic field of the knife (~4 mm). A low-$J_c$ region at the right side of the tape, marked by an arrow in FIG. 4, re-appears in the magnetic-knife measurements of the striated sample but not in the $I_c$ measurements on the individual filaments, possibly for the same reason. The left most cut is not fully developed at positions m and I.

The samples investigated showed a relatively high overall homogeneity. However, there were finer features that could be correlated to growth-related sample properties. The data show that the embodiment magnetic knife can provide more information than XRD measurements or $I_c$ measurements on individual filaments alone.

In summary, because of its straight-forward and inexpensive design, this $J_c$ imaging method and device can be powerful tools for quality control in coated-conductor production.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. For example, there is more than one way to measure the current distribution. FIG. 5a shows a single magnetic knife (case 1) that is scanned across the tape perpendicular to the current direction and a V(I) curve is measured successively at each position. FIG. 5b shows an assembly of magnetic knives at different positions perpendicular and along the current direction for in-production-line measurements (case 2). The tape moves through the set of knives and the V(I) curves for one position along the current flow (x) and different positions perpendicular to it (y) are measured successively. By measuring the x part of the current density at different positions along the tape, a 2-dimensional map of the current density can be obtained. An increase in speed can be achieved using the assembly of fixed magnetic knives spaced across the width of a coated conductor (FIG. 5b) and then the superconducting tape is moved smoothly through the ensemble. Different positions along the tape are measured sequentially. All the measurements can be done in real time at the same time, which reduces the measuring time by a factor of N where N is the number of knives in the ensemble. All measurements are performed in parallel and at the same time.

It is intended that the scope of the invention be defined by the claims appended hereto.

What is claimed is:

1. An apparatus for measuring the magnetic flux of a coated conductor, comprising:
    a first and a second pair of permanent magnets, each permanent magnet having a magnetic north end and a magnetic south end, each magnet having the same shape as the other magnets or nearly the same shape,
    a first and a second pair of non-magnetic holders, each holder having a slot with a first end and a second end, each slot configured for receiving said first pair or said second pair of magnets, the magnets of a pair in a slot being adjacent each other where the south end of one magnet and the north end of the other magnet are at the same end of the slot,
    said first holder and second holder held in place opposite each other with a small space in between the holders for receiving a coated conductor, the slot of the first holder aligned with the slot of the second holder, the holders arranged with the north end of a magnet of the first holder nearest the south end of a magnet of second holder, wherein the device produces a magnetic field strength that becomes a minimum in the space between the first and second holder along an intersection between the first pair of permanent magnets and the second pair of permanent magnets,
    means for moving the coated conductor through the space in between the two holders, and
    means for adjusting said holders in a direction transverse to the coated conductor without readjusting the position of the holders relative to each other.

2. The device of claim 1, wherein the coated conductor is a superconductor.

3. A method for measuring the critical current $I_c$ in a coated conductor, comprising:
    (a) providing an apparatus comprising:
        a first and a second pair of permanent magnets, each permanent magnet having a magnetic north end and a magnetic south end, each magnet having the same as the other magnets or nearly the same shape,
        a first and a second pair of non-magnetic holders, each holder having a slot with a first end and a second end, each slot configured for receiving said first pair or said second pair of magnets, the magnets of a pair in a slot being adjacent each other where the south end of one magnet and the north end of the other magnet are at the same end of the slot,
        said first holder and second holder held in place opposite each other with a small space in between the holders for receiving a coated conductor, the slot of the first holder aligned with the slot of the second holder, the holders arranged with the north end of a magnet of the first holder nearest the south end of a magnet of second holder, wherein the device produces a magnetic field strength that becomes a minimum in the space between the first and second holder along an intersection between the first pair of permanent magnets and the second pair of permanent magnets,
        means for moving the coated conductor through the space in between the two holders, and
        means for adjusting said holders in a direction transverse to the coated conductor without readjusting the position of the holders relative to each other, and
    (b) sending a coated conductor having a first end and a second end through the space between the first holder and second holder, the apparatus being immersed in liquid nitrogen, and
    (c) generating a first current through the coated conductor as the coated conductor is at a first position,
    (d) measuring the voltage across the coated conductor as the first current is generated;
    (e) moving the coated conductor to a second position, and
    (e) measuring the current and the voltage at the second position,
    (g) repeating steps (e) and (f) to generate a voltage-current curve (a V(I) curve, and
    (g) using the voltage-current curve to determine the critical current $I_c$ of the coated conductor.

4. The method of claim 2, wherein the coated conductor is striated.

5. The method of claim 3, wherein step (a) comprises providing a plurality of apparatus at different positions transverse to the coated conductor.

* * * * *